United States Patent
Blumenthal

(10) Patent No.: US 9,882,646 B2
(45) Date of Patent: *Jan. 30, 2018

(54) SYSTEM AND METHOD FOR REDUCED POWER CONSUMPTION AND HEAT REMOVAL IN OPTICAL AND OPTOELECTRONIC DEVICES AND SUBASSEMBLIES

(71) Applicant: OE Solutions America, Inc., Englewood Cliffs, NJ (US)

(72) Inventor: Daniel Jacob Blumenthal, Santa Barbara, CA (US)

(73) Assignee: OE SOLUTIONS AMERICA, INC., Ridgefield Park, NJ (US)

(*) Notice: Subject to any disclaimer, the term of this patent is extended or adjusted under 35 U.S.C. 154(b) by 0 days.

This patent is subject to a terminal disclaimer.

(21) Appl. No.: 15/164,313

(22) Filed: May 25, 2016

(65) Prior Publication Data

US 2016/0269119 A1    Sep. 15, 2016

Related U.S. Application Data

(63) Continuation of application No. 13/866,784, filed on Apr. 19, 2013, now Pat. No. 9,370,123.

(Continued)

(51) Int. Cl.
*H01S 5/024* (2006.01)
*H04B 10/40* (2013.01)
(Continued)

(52) U.S. Cl.
CPC .......... *H04B 10/40* (2013.01); *G02B 6/4271* (2013.01); *H01S 3/0405* (2013.01);
(Continued)

(58) Field of Classification Search
CPC ... H04B 10/40; H04B 10/503; H01S 5/02469; H01S 3/0405; H01S 5/02284;
(Continued)

(56) References Cited

U.S. PATENT DOCUMENTS

| 4,485,475 A | 11/1984 | Large |
| 6,172,997 B1 | 1/2001 | Miyake |

(Continued)

FOREIGN PATENT DOCUMENTS

| KR | 1020020063691 A | 8/2002 |
| KR | 1020040067701 A | 7/2004 |
| TW | 201039472 A1 | 11/2010 |

OTHER PUBLICATIONS

International Search Report and Written Opinion of the International Searching Authority for PCT Application No. PCT/US2013/037450, dated Jul. 25, 2013, 11 pgs.

*Primary Examiner* — Xinning Niu
(74) *Attorney, Agent, or Firm* — Ichthus International Law PLLC

(57) ABSTRACT

A heat removal system for use in optical and optoelectronic devices and subassemblies is provided. The heat removal system lowers the power consumption of one or more active cooling components within the device or subassembly, such as a TEC, which is used to remove heat from heat generating components within the device or subassembly. For any particular application, the heat removal system more efficiently removes the heat from the active cooling component, by using a heat transfer assembly, such as a planar heat pipe type assembly. The heat transfer assembly employs properties like, but not limited to, phase transition change and thermal conductivity to move heat without external power. In some embodiments, the heat transfer assembly can be used to allow the active cooling component, such as a TEC (Continued)

to be removed, leaving the heat transfer assembly to remove the heat from the device or subassembly.

12 Claims, 6 Drawing Sheets

Related U.S. Application Data

(60) Provisional application No. 61/635,694, filed on Apr. 19, 2012.

(51) Int. Cl.
*H05K 7/20* (2006.01)
*H01S 3/04* (2006.01)
*G02B 6/42* (2006.01)
*H01S 5/022* (2006.01)
*H04B 10/50* (2013.01)

(52) U.S. Cl.
CPC ..... *H01S 5/02469* (2013.01); *H05K 7/20336* (2013.01); *H01S 3/0401* (2013.01); *H01S 5/02284* (2013.01); *H01S 5/02407* (2013.01); *H01S 5/02415* (2013.01); *H01S 5/02438* (2013.01); *H04B 10/503* (2013.01)

(58) Field of Classification Search
CPC ............. H01S 5/02407; H01S 5/02415; H01S 5/02438; H01S 3/0401; G02B 6/4271; H05K 7/20336
See application file for complete search history.

(56) References Cited

U.S. PATENT DOCUMENTS

| | | |
|---|---|---|
| 6,285,476 B1 | 9/2001 | Carlson |
| 6,304,354 B2 | 10/2001 | Carlson |
| 6,685,364 B1 | 2/2004 | Brezina |
| 6,768,827 B2 | 7/2004 | Yoo |
| 6,807,340 B2 | 10/2004 | Postolek |
| 6,817,096 B2 | 11/2004 | McCullough |
| 6,852,928 B2 | 2/2005 | Giaretta |
| 6,863,118 B1 | 3/2005 | Wang |
| 6,958,907 B2 | 10/2005 | Sato |
| 6,973,106 B1 | 12/2005 | Chaoui |
| 6,992,895 B2 | 1/2006 | Lindberg |
| 7,066,659 B2 | 6/2006 | Aronson |
| 7,308,206 B2 | 12/2007 | Larson |
| 7,458,733 B2 | 12/2008 | Anderl |
| 7,532,826 B2 | 5/2009 | Zhu |
| 7,554,805 B2 | 6/2009 | Liu |
| 7,561,805 B2 | 7/2009 | Aoki |
| 7,804,867 B2 | 9/2010 | Scofet |
| 8,186,892 B2 | 5/2012 | Hosking |
| 8,337,096 B2 | 12/2012 | Shen |
| 9,370,123 B2 * | 6/2016 | Blumenthal ....... H05K 7/20336 |
| 2002/0028598 A1 | 3/2002 | Bolliger |
| 2004/0151505 A1 | 8/2004 | Aronson |
| 2006/0083517 A1 | 4/2006 | Saito |
| 2006/0088271 A1 | 4/2006 | Ghoshal |
| 2006/0156737 A1 | 7/2006 | Liu |
| 2007/0211772 A1 | 9/2007 | Romano |
| 2008/0023720 A1 | 1/2008 | Yang |
| 2009/0010653 A1 | 1/2009 | Aoki |
| 2009/0092162 A1 | 4/2009 | Huff |
| 2009/0159243 A1 | 6/2009 | Zhao |
| 2009/0196631 A1 | 8/2009 | Daghighian |
| 2011/0033192 A1 | 2/2011 | Daiber |
| 2011/0044006 A1 | 2/2011 | Kim |
| 2011/0062312 A1 | 3/2011 | Hosking |
| 2011/0081120 A1 | 4/2011 | Nguyen |
| 2011/0120674 A1 | 5/2011 | MacDonald |
| 2011/0222567 A1 | 9/2011 | Scofet |
| 2012/0039572 A1 | 2/2012 | Amirkiai |
| 2012/0075798 A1 | 3/2012 | Chang |
| 2012/0076505 A1 | 3/2012 | Azemati |
| 2012/0082450 A1 | 4/2012 | Daghighian |
| 2012/0147560 A1 | 6/2012 | Zeng |
| 2012/0213513 A1 | 8/2012 | Chao |
| 2012/0301154 A1 | 11/2012 | Allouche |

* cited by examiner

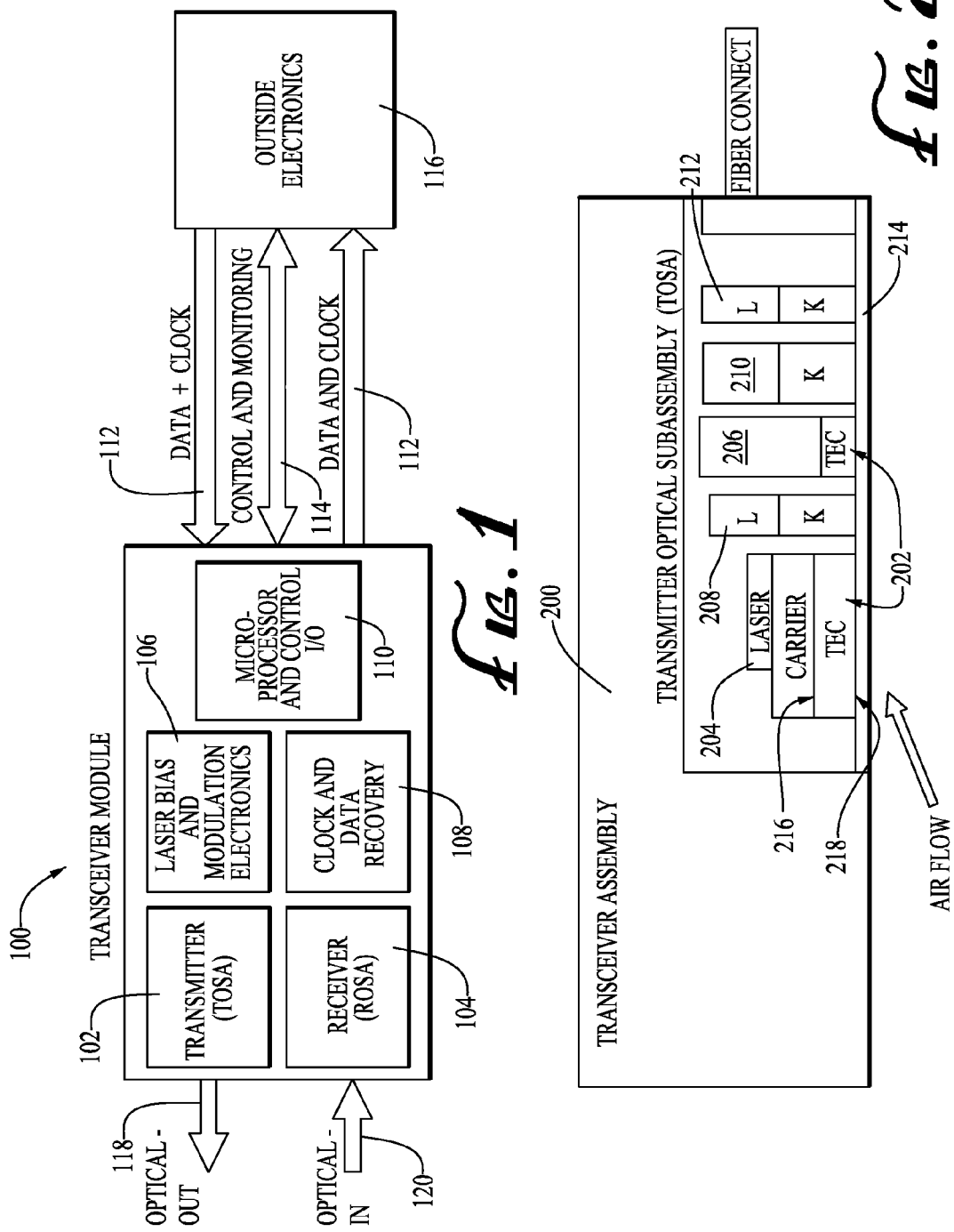

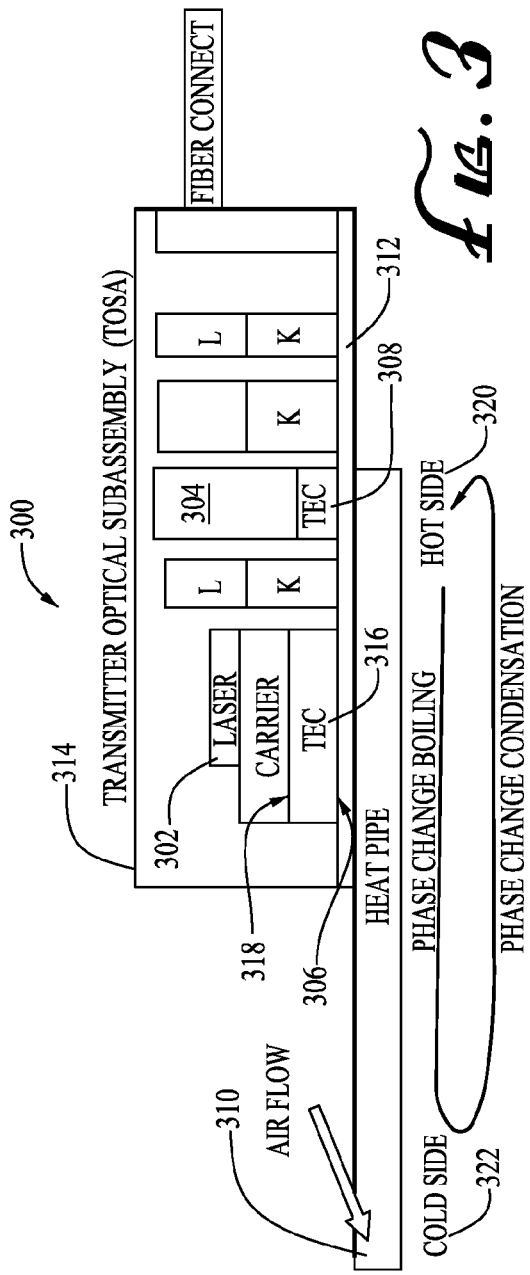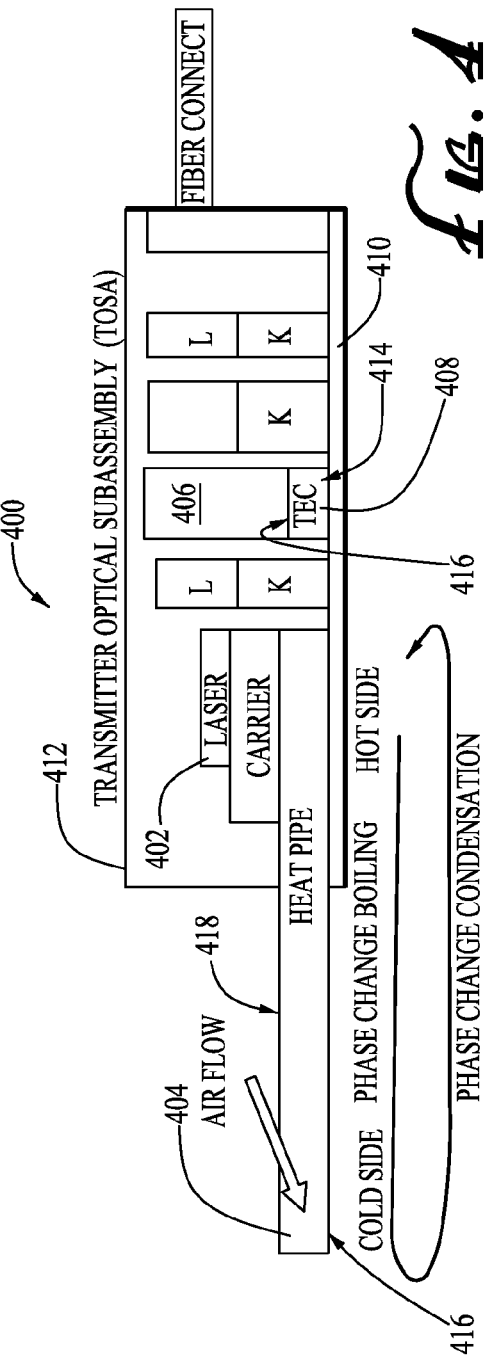

SYSTEM AND METHOD FOR REDUCED POWER CONSUMPTION AND HEAT REMOVAL IN OPTICAL AND OPTOELECTRONIC DEVICES AND SUBASSEMBLIES

CROSS-REFERENCE TO RELATED APPLICATION(S)

This application is a Continuation of U.S. application Ser. No. 13/866,784, filed on Apr. 19, 2013, claiming priority to U.S. Provisional Application No. 61/635,694, filed on Apr. 19, 2012, the entire contents of which are incorporated herein by reference in their entirety.

BACKGROUND

Data that is converted between optical and electrical formats when transferred over fiber optics is typically accomplished by using photonic or optoelectronic devices that are contained in modules or subassemblies such as a transceiver module. A transceiver module typically contains a laser transmitter circuit capable of converting electrical signals to optical signals, and an optical receiver capable of converting received optical signals to electrical signals. These modules then interface with host devices such as line cards, routers, networks, host computers, switching hubs, etc., and there are many applications for transceiver modules ranging from fiber to the home, data centers, long haul and high-performance communications.

Transceivers may be manufactured in a form factor called a pluggable, and international industry standard have been adopted to define parameters such as the physical size, shape, and power requirements of these transceivers. Examples include SFP (Small Form-factor Pluggable) transceivers, CFP (C Form-factor Pluggable), XFP (Small Form-factor Pluggable) transceivers, and XFP+ (Enhanced Small Form-factor Pluggable) transceivers. Other transceivers can be built directly onto a circuit card or onto a daughter card that plugs into a main circuit card. With increased data rates, smaller transceiver packages and the need to locate very high capacities of fiber optic input/output on single line cards or low footprint switching boxes, the heat generation due to optical transceivers has become a major problem. Heat generation and power dissipation affect the performance and durability of the transceiver and surrounding components and systems, if the heat is not dissipated from the transceiver to a standard temperature range via air flow or other efficient cooling mechanism for the line card and system that the transceiver is part of. Heat created by heat generating components of the transceiver, such as lasers, modulators, optical amplifiers, receivers and associated electronics and thermal management components, is accordingly removed from devices by passive thermal dissipation or use of an active cooling device. However, the removal of heat using traditional passive dissipation places limits on the technology in the transceiver, particularly the laser transmitter. For high performance systems actively cooled devices increases the complexity and cost of the transceiver as well as the overall power and size.

Further, optical subassemblies and internal devices like Transmitter Optical Subassemblies (TOSA), Receiver Optical Subassemblies (ROSA), photonic integrated circuits and associated driving, detecting, and control circuitry generate heat and may require temperature stabilization to meet the specifications for a certain communications environment and/or application. In addition, certain elements have performance and operating characteristics that are dependent on the device temperature, the ambient temperature range, and the required cooling from the device perspective and the system perspective. There are a variety of techniques to remove the heat from a device or component that is actively cooled, for example forced air cooling, simple convection cooling, or thermoelectric cooling (TEC) and possibly liquid cooling. For high performance transceivers, the amount of heat to be removed requires active cooling which in itself significantly drives up the power consumption and heat dissipation as well as the size of these components. Today, active cooling is typically accomplished using an electrically active device like a thermo-electric cooler (TEC) of the photonic circuits and/or other components that are not designed to be athermal or insensitive to temperature changes. Since many photonic circuits and associated components are not athermal, especially with high performance specifications where data is transmitted and received on the fiber at distances greater than 10 kilometers and where fine optical frequency spacing is employed as in dense wavelength division multiplexing, new energy and costs efficient cooling techniques are needed.

A disadvantage of active cooling, such as with a TEC, is that the TEC itself requires power, generates heat and takes up space. The power consumed can be equal to or greater than that of the components whose temperature is being stabilized. Typical TECs can require up to 3 W or more power depending on the amount of heat that must be transferred from a device to an ambient temperature and the resulting amount of current that must be applied to the TEC to remove the generated heat.

Known prior art attempts to control the temperature of a laser in a communication system include actively cooling the laser with a thermoelectric cooler which is attached to a heat sink. Additional heat is removed from the heat sink using a heat pipe or other solid heat transfer device in a heat transfer relationship between a second heat sink. In other systems, heat pipes are used to cool a laser diode by providing a thermally conductive path between a laser diode heat sink and a thermoelectric cooler heat sink. Examples of such thermal subsystems can be found in U.S. Pat. No. 6,285,476. Disadvantageously, however, these thermal subsystems dissipate heat through a complex system of multiple heat sinks interconnected with heat pipes or solid heat straps which are far removed from the heat generating component of the device, adding to the complexity and size of the device. These systems also employ materials and designs that are not compact enough to form fit into today's optical transceivers or transceiver assemblies or subassemblies, or they employ materials that oxide or corrode limiting the performance lifetime (like copper), or materials that cannot be machine using new micro-channel and nano-feature technologies that satisfy the requirements of heat removal from photonic or optoelectronics devices and/or electronics used in conjunction with these devices.

Therefore, it would be advantageous to develop and implement approaches, methods and apparatus that allow photonic, optical and optoelectronic devices and components to be utilized in real world applications without the use of an active cooling element like a TEC or reduce the amount of work, and therefore the power consumption required to drive the active cooling element under a set of given conditions. It would also be advantageous if the components of the heat removal system are compact to fit into small footprint optical and optoelectronic devices and subassemblies to meet the requirements of today's network devices and have minimal amounts of interconnecting parts for ease of assembly. It would be further advantageous if the device and components can work in the required temperature range for various applications, in particular, the laser and other optics that are housed in the TOSA, and other optics and electronics in the ROSA whose functions are optimized by constant temperature.

SUMMARY

According to the present invention, there is provided an apparatus that employs a heat transfer assembly, such as a substantial planar heat pipe type assembly or other equivalent passive thermal transfer technology that removes heat more efficiently from heat sources in various assemblies and subassemblies employed in the optical and optoelectronic arena.

According to one embodiment, a heat control system for use in an optical or optoelectronic device or subassembly is provided. The heat control system comprises a housing for containing the optical or optoelectronic device or subassembly and one or more heat generating components that can be optical or supporting electronic circuitry. An active cooling component is positioned in thermal contact with the at least one of the heat generating components and a heat transfer assembly is positioned in thermal connection with the active cooling component. The heat transfer assembly is preferably a substantially planar two dimensional vessel that more preferably combines both thermal conductivity and phase transition. In certain embodiments, the heat transfer assembly may provide a mechanical supporting structure a heat generating component. In some embodiments, the thermal connection between the active cooling component and the heat transfer assembly may be a conductive platform which serves as the base of the housing. The heat generating component may be a laser, or may be a photonic integrated circuit or an optoelectronic circuit. Preferably, the active cooling component is in thermal connectivity with the photonic integrated circuit or an optoelectronic circuit, and the heat transfer assembly is in thermal connection with the active cooling component. Using this invention, non-heat generating elements, like optical etalons, can have their temperature maintained for required performance and operation.

In a preferred embodiment, the heat transfer assembly extends substantially the width of the housing. In some preferred embodiments, the heat transfer assembly also extends beyond the surface area of the heat transfer assembly and a length of the heat transfer assembly is exposed at least in part externally to the housing. Also preferably, the heat transfer assembly is less than 1 mm in height, and extends substantially over the area of the active cooling component. In some embodiments, the heat transfer assembly is a substantially planar heat pipe type assembly comprising a two-dimensional vessel having interior nano-structures or micro-structures, which increase the interior surface area and heat transfer, i.e., cooling capacity of the heat transfer assembly. Preferably, the substantially planar heat pipe type assembly comprises interior nano-structures or micro-structures, more preferably the substantially planar heat pipe type assembly and nano-structures/micro-structures comprise titanium.

In another embodiment, the device or subassembly comprises one or more, and preferably at least two heat generating components and at least one or more active cooling component. The heat transfer assembly is in thermal connection with at least one or more of the active cooling components. Preferably, the one or more heat generating components and active cooling components are configured to stack vertically on top of the heat transfer assembly. In another embodiment, the conductive platform is disposed in between the heat transfer assembly and the active cooling component and the heat transfer assembly is exposed at least in part external to the housing.

In another embodiment, the heat transfer assembly is in direct thermal connection and direct mechanical connection with the active heat removal element. Preferably, the heat transfer assembly is in direct thermal connection and direct mechanical connection with the active heat removal element, and the active heat removal is in direct thermal connection and direct mechanical connection with at least one of the heat generating components.

In other embodiments, the heat control system also has a heat dissipating apparatus, such as a fin, in thermal connection with the heat transfer assembly.

The heat control system may be used for heat control of a photonic or optoelectronic circuit. In this embodiment, an active cooling component is positioned in thermal connection with the photonic integrated circuit or optoelectronic circuit and the heat transfer assembly is positioned in thermal connection with the active cooling component. Optionally, a heat dissipating apparatus is positioned in thermal connection with the heat transfer assembly.

The heat control system may also be used in a transmitter optical subassembly. Preferably, the transmitter optical subassembly comprises a pluggable transceiver or transceiver circuit embedded onto an electronic line card, daughter card or other portion of a system communicating with a fiber optic transmission channel or subsystem. According to this embodiment, a circuit comprising a photonic integrated circuit or optoelectronic circuit disposed within a transmitter optical subassembly housing. A thermoelectric cooler, or other active cooling device is positioned in thermal connection with the circuit and a heat transfer assembly, as described herein, is thermally connected to the thermoelectric cooler or other active cooling device. Preferably, the circuit and thermoelectric cooler one are configured to stack vertically on top of the heat transfer assembly and to fit within the housing.

In another embodiment of the invention, the active cooling element is omitted from all or a portion of the device or subassembly and the heat transfer assembly is positioned in direct thermal connection to the heat generating component. In a preferred embodiment, the heat control system is used for heat control of a photonic or optoelectronic circuit. In this embodiment, a heat transfer assembly comprising a substantially planar two dimensional vessel which combines both thermal conductivity and phase transition is positioned in direct thermal and mechanical connection with the photonic integrated circuit or optoelectronic circuit. The heat transfer assembly may provide a mechanical supporting structure for the photonic integrated circuit or optoelectronic circuit. The heat transfer assembly may also provide with the addition of the appropriate electrically insulating and conducting layers, electrical interconnection between optical, photonic or optoelectronic circuit and control and measurement elements including digital electronic circuits, logic and memory devices, RF electronic circuits, circuits that convert between analog and digital signals and temperature measurement elements, among other elements. Optionally, a heat dissipating apparatus is positioned in thermal connection with the heat transfer assembly. In one embodiment, components such as electronic circuitry, electronic interconnects, insulting and conducting patterns, electronic circuits, electronic components, and sensing components, are mounted, i.e., positioned in direct mechanical and/or direct electrical connection on the heat transfer assembly to allow the heat transfer assembly to also serve as the electronic interconnect or circuit for the photonic or optoelectronic devices and connected electronics and other devices.

FIGURES

These and other features, aspects and advantages of the present invention will become better understood from the following description, appended claims, and accompanying figures where:

FIG. 1 illustrates an exemplary prior art transceiver device;

FIG. 2 illustrates an exemplary prior art transceiver device having a thermo-electric cooler (TEC);

FIG. 3 is a side view of an exemplary arrangement of a transmitter optical subassembly showing the heat control system according to one embodiment of the present invention;

FIG. 4 is a side view of an exemplary arrangement of a transmitter optical subassembly showing the heat control system according to another embodiment of the present invention;

Figure 7:
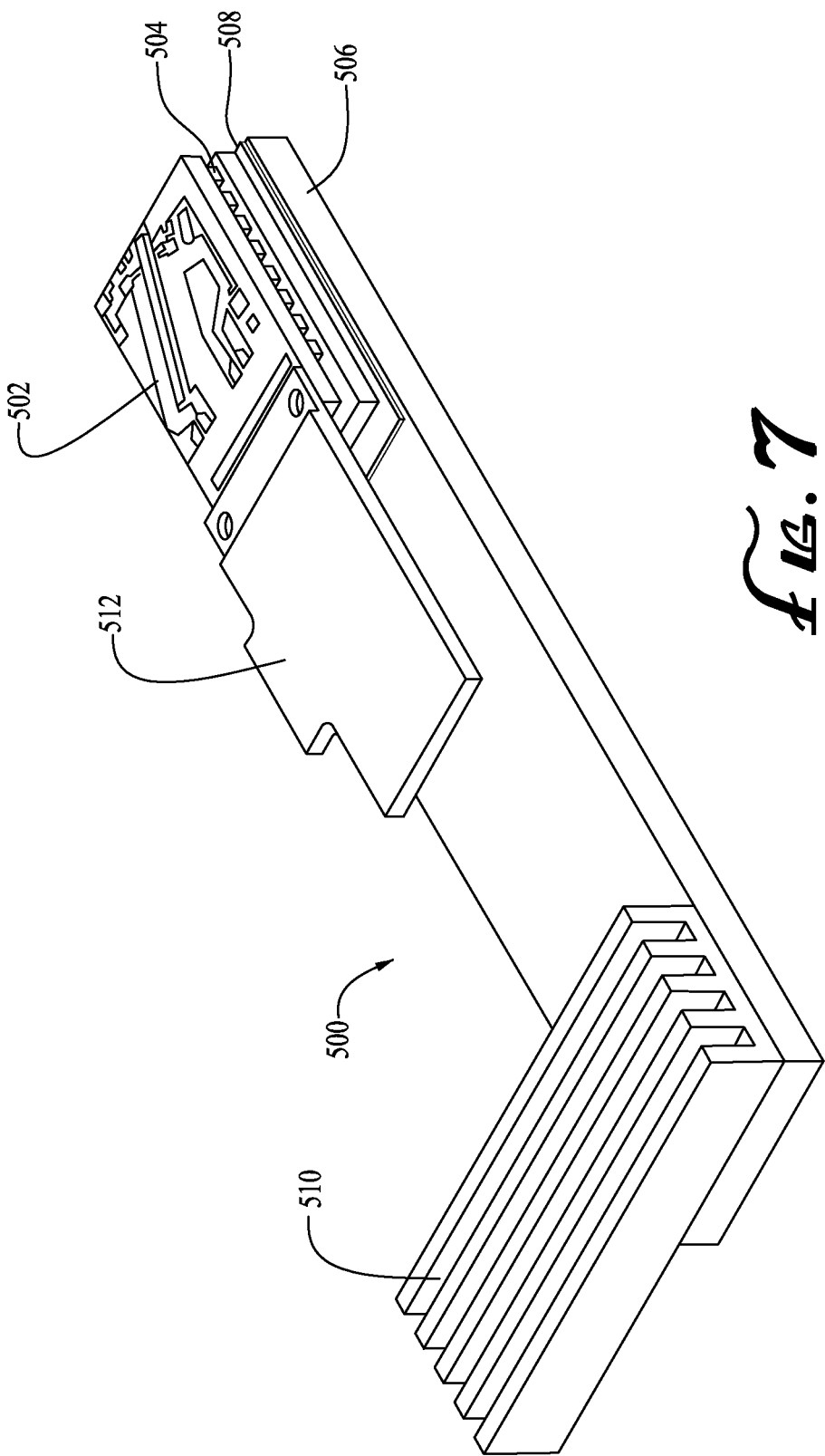
Figure 8:
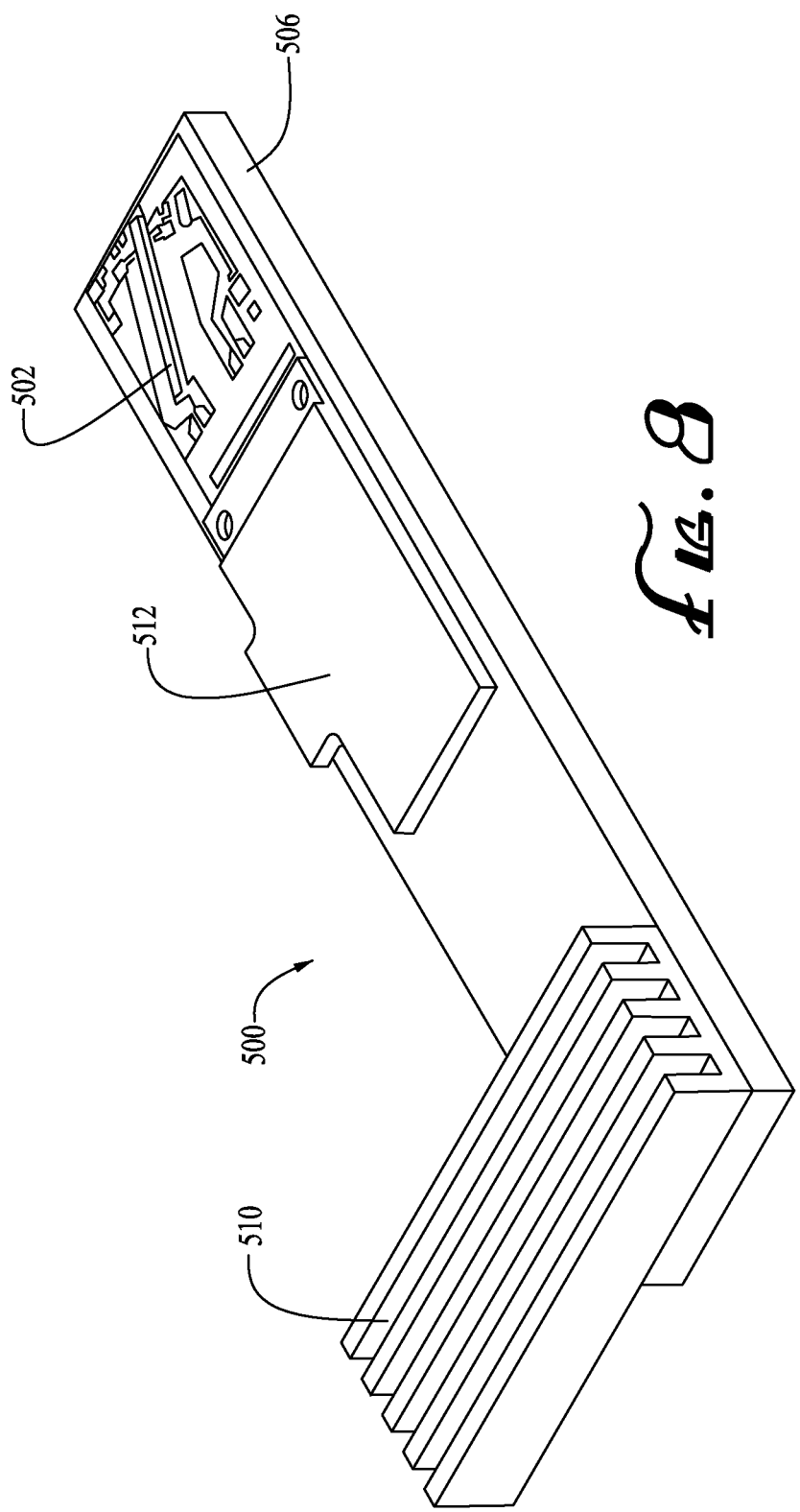

FIG. 7 is a perspective view of another exemplary arrangement of the heat control system according to the present invention, showing a TEC in thermal connection with a heat transfer assembly and a circuit; and FIG. 8 is a perspective view of another exemplary arrangement of the heat control system according to the present invention, showing a heat transfer assembly in direct thermal connection to and a circuit and flex ribbon.

DESCRIPTION

According to one embodiment of the present invention, there is provided a heat control system for use in optical and optoelectronic devices and subassemblies including devices such as transceivers, transmitters and transmitter assemblies, and other optical and optoelectronic devices and subassemblies that benefit from heat removal and/or temperature stabilization. The heat control system allows the optical and optoelectronic subassemblies to operate at lower power consumption through more efficient heat dissipation than known active heat removal solutions. Further, the heat control system according to the present invention can be incorporated into devices and subassemblies with a small footprint for use in small form factors.

More particularly, there is provided a pluggable transceiver or transceiver circuit embedded onto an electronic line card, daughter card or other portion of a system communicating with a fiber optic transmission channel or subsystem, which can support a broad variety of optical to electrical and electrical to optical conversion protocols for telecommunications and data communications systems and applications. According to the present invention, a heat transfer assembly (also referred to herein as a heat pipe) is incorporated into a transceiver, more preferably a pluggable transceiver, or a sub-module thereof, and the heat transfer assembly is positioned in thermal connection to heat generation sources in optical devices and subassemblies that require constant temperature and/or heat removal.

As used herein, the term "heat transfer assembly" also referred to herein as a "heat pipe" or "heat pipe type assembly" comprises a substantially planar two dimensional vessel which combines both thermal conductivity and phase transition. The heat transfer assembly is a heat transfer device having high thermal conductivity in a very small footprint, low profile, and fabricated from a material that can be connected thermally to other materials. The heat transfer assembly can also and can act as a substrate for metallization and mounting photonic and electronic circuits. The heat transfer assembly is a low profile (e.g., less than 1 mm) thermal ground plane that conducts heat through the heat pipe phase change mechanism. In some embodiments, the heat transfer assembly has internal structures, e.g., nano scale pillars that form a very high surface area to facilitate heat exchange. The heat transfer assembly is distinguished from other thermally conductive bodies which are not planar and do not have the combined properties of thermal conductivity and phase transition.

As used herein, the term "heat generating source(s)" or "heat generating component(s)" refers to devices and subassemblies which require removal of heat to stabilize the temperature for proper, optimal, or preferred operation. The term also refers to other components which are passive non-heat generating components or devices that benefit from heat removal or stabilization and/or whose temperature is maintained at a precise value in the presence of fluctuating ambient conditions, such as an etalon, for proper, optimal, or preferred operation. The term also encompasses the term devices or components to be cooled, as used herein.

In a one embodiment, the heat transfer assembly is positioned in thermal connection with an active heat removal device like a TEC. Preferably, according to this embodiment, the heat transfer assembly is positioned in direct mechanical and direct thermal connection with the active heat removal device without an intervening thermal subsystem, such as a heat sink. In another embodiment, the heat transfer assembly is positioned in thermal connectivity with the heat generation sources in the optical devices and subassemblies without a TEC. Preferably, according to this embodiment, the heat transfer assembly is positioned in direct mechanical and direct thermal connection with the heat generation source.

Temperature stabilization and heat removal in optical and optoelectronic devices and subassemblies may be accomplished using an active heat removal device such as a thermo-electric cooler (TEC). A TEC is a device that uses the Peltier effect to create a heat flux between the junction of two different types of materials when current is passed through the device. When electrical power is supplied to the TEC, one side of the TEC generates heat and the other side is cooled. When cooling a heat generating component or device, the heat generating component is mounted to the heat absorbing side of the TEC and the other side of the TEC, i.e., the heat rejecting side, is connected to a thermal ground, or conductor, or is cooled with airflow or other heat dissipation method.

The heat control system according to the present invention reduces the thermal impedance between the device to be cooled and the eventual heat removal mechanism. The devices to be cooled include photonic, optoelectronic and electronic heat sources as well as supporting electronic circuitry, electronic elements and other measurement and control devices. The heat control system of the invention minimizes the thermal impedance between the heat sources and heat removal elements while also providing a platform to form electrical interconnections, an electric ground plane or planes, a thermal ground plane and/or a mechanical supporting structure. These features of the heat control system have been found to be highly advantageous in building energy efficient, low power, compact and reliable optical communications components.

According to one embodiment of the present invention, the heat control system works with known active heat removal devices, such as a TEC, to lower the power consumption of the active heat removal device used in optical and optoelectronic devices and subassemblies. In other embodiments, the heat control system operates directly with the heat generating components of the optical and optoelectronic devices and subassemblies to lower power consumption without the use of an active heat removal device, such as a TEC.

The advantages of the heat control system according to the present invention include, reduced power consumption for compact optical and optoelectronic devices and subassemblies, a smaller footprint, lower cost, and broader applications for optical, integrated optic and optoelectronic technologies. Further, the heat control system according to the present invention is capable of meeting the needs of today's WDM networks including lower cost and lower power consumption transceivers, particularly pluggable transceivers. Transceivers and accompanying components for today's WDM networks must operate over a required ambient temperature range, for example −20 to +100 degrees Fahrenheit (+20 to +50 degrees Celsius), for data centers or wider temperature ranges for telecommunications or other applications. However, the laser and other optics and electronics that are housed in the TOSA, and other optics and electronics in the ROSA, and other portions of the transceiver, are held to a more constant temperature in order to function. This is particularly true of the laser and other optic components like a Fabry-Perot etalon, a well-known and widely used device for locking the laser output to a desired wavelength or optical frequency. Certain components, like the laser, require removal of heat to stabilize the temperature and to fix the laser output properties. Other components like the etalon are passive devices whose temperature must be maintained at a precise value in the presence of fluctuating ambient conditions.

The heat control system according to the present invention is capable of lowering power consumption while at the same time effectively and efficiently providing heat removal/cooling in a cost effective manner. In addition, the heat control system is capable of being implemented into a variety of optical devices and optoelectronic devices, meaning devices having both optical and electrical components, such as transponders, transceivers, transmitters, and/or receivers and a variety of form factors including SFP, CFP, XFP, and XFP+ conforming devices for implementation into today's WDM networks, and other systems including various telecommunications networks, local area networks, metro area networks, storage networks, wide area networks and the like. However, the present invention is not limited to pluggable transceiver form factors and can be used for transceivers built directly onto circuit cards, daughter cards or other subassemblies. It will be appreciated that the devices and systems according to the present invention need not comply with standardized form factor requirements and the principles of the present invention are adaptable to a variety of sizes and configurations according to various design parameters. Further, the heat control system according to the present invention is adaptable for use in devices which are suitable for many data rates including but not limited to 1 Gigabit per second, 2 Gigabit per second, 4 Gigabit per second, 10 Gigabit per second and higher bandwidth fiber channels.

Further, the heat control system according to the present invention is important to the use of optical and optoelectronic devices and subassemblies in communications applications. As the performance and functionality of optoelectronic devices and subassemblies, in particular the TOSA, ROSA and pluggables, increases, and their size decreases, it becomes increasingly important that excess heat generation is removed efficiently and without consuming unneeded excess power. Removal of the active cooling element, such as the TEC, all together, or reducing the amount of work it does is accordingly an important technological innovation.

The heat control system minimizes thermal impedance between the heat sources and heat removal elements and at the same time can provide a platform to form electrical interconnections, an electric ground plane or planes, a thermal ground plane and/or a mechanical supporting structure. Accordingly, the heat control system according to the present invention is capable of being implemented into a highly compact form with superior performance.

Referring now to FIG. 1, an example of a prior art transceiver 100 is shown. Prior art transceivers 100, as illustrated in FIG. 1, incorporate a transmitter optical subassembly (TOSA) 102 or optical transmitter equivalent circuit or subassembly and a receiver optical sub-assembly (ROSA) 104 or optical receiver equivalent circuit or subassembly as well as various analog and digital electronics for modulation, clock and data recovery, and control 106, 108, and 110 that communicate with the TOSA and ROSA as well as control other information and functions within the transceiver 100 and outside the transceiver 100, such as data and clock 112, control and monitoring 114, and other outside electronics 114 that sit outside the transceiver 100 or in other embodiments may be contained all or partially inside the transceiver depending on the application and architecture. The transmitter 100, includes optics (not shown), such as a laser (12) that are in the TOSA 102 or equivalent and optics, such as a photodetector (not shown) are housed in the ROSA 104 or its equivalent. The transmitter 102, part of the transceiver 100, uses optics that launch a transmitted optical signal 118 onto the fiber (not shown). The receiver 104 part of the transceiver 100 uses optics to receive a received optical signal 120, which is then converted and transmitted as an electrical signal by the transceiver 100. For low-cost applications, ultra low cost lasers (not shown) operating at 850 nm or 1310 nm with the capability to transmit over short distances are used (e.g. 100 m to 2 km). In some designs, these, or other lasers are cooled, while in other designs, the lasers can be operated as uncooled. For higher performance fiber transmission optics operating in the 1550 nm window, or when surrounding wavelength windows are employed, temperature plays a more critical factor.

Referring now to FIG. 2, an exemplary prior art transceiver assembly is illustrated. In FIG. 2, a prior art transceiver assembly 200, having a thermo-electric cooler (TEC) 202, which is used as an active component to removed heat generated from heat generating devices is shown. The transceiver 200 comprises one or more heat generating components, such as a laser/transmitter 204 and/or passive components that do not generate heat but require temperature stabilization such as the etalon 206 as well as other components 208, 210, 212 of the transceiver 200, which rest on a platform 214, a platform that is typically made of a good thermally conducting material that is also thermally stable and has other desirable properties to manufacture such components. In transceiver 200 devices, such as shown in FIG. 2, heat generating devices like a laser/transmitter 202 are in thermal communication with the TEC 202, which transfers heat to the outside of the transceiver 200, through a thermally conductive plate, which is then cooled by active air flow, convection or other heat transfer process. In prior art devices, the TEC 202 is also used to set the operating temperature and hence the cavity length of the etalon 206. The TEC 200 itself, depending on the temperature difference between the top side of the TEC 216, which is the side adjacent to the component to be cooled or to be maintained at a temperature, and the bottom side of the TEC 218, which is the heat rejecting side, located at the far side from the component to be cooled and consumes a certain amount of power. For a given heat load on the heat removal side, more power is required to cool the heat removal side as the temperature increases and as the temperature difference between the heat generation and heat removal side increases.

Other approaches to reduced power consumption involve designing the actual devices and components so that they can be operated over a given ambient environmental temperature range and the properties of the device do not change or are robust to over this fluctuation, called a-thermal designs. However, there are wide ranges of passive and active devices that cannot today be made a-thermal (insensitive to a range of temperature changes). Other approaches utilize solid materials such as copper, or materials fabricated with increased surface area such as heat sinks, to remove heat. However, these materials and structures are not highly efficient at removing heat in these applications and environments when employed on their own.

According to the present invention, a heat removal system has been found that more efficiently removes heat from a heat source or heat generating components in an optical or optoelectronic device or subassembly to significantly reduce the power consumption in the optical or optoelectronic device or subassembly. Transceivers, transmitters and transmitter assemblies, and other optical and optoelectronic devices and subassemblies are provided that have reduced power consumption and/or enhanced temperature control and/or temperature stability within the device or subassembly. These devices and subassemblies have heat generating components and either require heat removal or temperature stabilization. The heat removal system according to the present invention allows these devices and subassemblies to operate at lower power consumption and heat dissipation than those that use other active cooling devices, such as a TEC, alone and/or other active heat removal solutions.

As will be understood by those of skill in the art, the heat removal system, devices and subassemblies according to the present invention, lowers the power consumption of the active cooling component, such as a TEC. For any particular application, the heat removal system more efficiently removes the heat from the TEC, by using a heat-pipe type heat transfer assembly. The heat-pipe heat removal system employs properties like, but not limited to, phase transition change to move heat without external power. In some embodiments, the heat-pipe heat removal system can be used to allow the active cooling component, such as the TEC, to be removed all together, leaving the heat transfer assembly to remove the heat from the device or subassembly. In addition to removing heat from heat generating components such as photonic or optoelectronic circuits, other co-located electronic circuits that are packaged with or near the photonics or optoelectronics can also have the heat removed by the heat removal system according to the invention.

Referring now to FIG. 3, a side view of an exemplary arrangement of a device 300, such a transmitter optical subassembly, is shown. The device 300 employs the heat control system according to one embodiment of the present invention. As shown in FIG. 3, the device 300 has one or more heat generating components, such as a laser/transmitter 302 or a passive non-heat generating component like an etalon 304. The heat control system comprises one or more active cooling components, 306, 308 such as thermo-electric coolers, which are in thermal connection with the heat generating components 302, 304. A heat transfer assembly 310, such as a heat pipe type assembly, is positioned in thermal connectivity with the one or more active cooling components 306, 308. The active cooling component 306, 308 is preferably in thermal connection with a heat conducting material, and heat is transferred from the active cooling component 306, 308, through the heat conducting material and then to the heat transfer assembly 310.

As shown in FIG. 3, in one embodiment, the bottom plate 312 of the housing 314 of the device 300, serves as a heat conducting material to transfer heat from the active cooling component 306, 308, to the heat transfer assembly 310. The TEC bottom plate 316, or heat rejecting side of the TEC, is in thermal connectivity with the bottom plate 312 of the housing 314. For example, when the device 300 is a transmitter optical subassembly (TOSA) or receiver optical subassembly (ROSA) or other optical package, the bottom plate 312 of the TOSA or ROSA housing 314, is the bottom of the optical package where the maximum heat is transferred from the heat rejecting side of the TEC. The bottom plate 312 is mounted directly to the heat removal element 310, e.g., a heat pipe, or equivalent passive assembly using a low thermal impedance bonding material.

In each stage that connects the heat generating region or regions on the heat generating component(s), such as photonic circuit or supporting electrical circuits, it is preferable to keep a minimum thermal resistance path between the heat removal elements 306, 308, and the heat transfer assembly 310, such as a heat pipe. As shown in FIG. 3, using the heat transfer assembly, such as heat pipe technology, the heat differential from the heat pipe hot side to the heat pipe cold side to the ambient air is transferred more effectively by using the passive device. The heat transfer assembly 310 in general might use a principle like a phase change of a liquid or other material to transfer heat from the hot side 320 (in thermal connectivity with heat rejecting side of the TEC (316)) to the cold side 322 of the heat transfer assembly 310. The heat transfer assembly 310 uses air flow or other methods to create a heat differential or gradient in the element 310. The use of a phase change process allows the element 310 to perform work on removing the heat from the TEC 306 without external power, as it is a closed system. This removal of heat from the TEC 306 allows the TEC 306 to be run at a lower current, thereby reducing the power consumption of the TEC 306, and overall power consumption of the device 300.

According another embodiment of the invention, one or more of the active cooling elements of an optical or optoelectronic device or subassembly is omitted from the device or subassembly and the heat transfer assembly is positioned in direct thermal connectivity with a heat generating component, such as a laser, or etalon or other heat generating circuitry. In this embodiment, one or more heat generating components is positioned in a direct thermal connection to the heat transfer assembly, thereby eliminating the power consumption, space and cost of the active cooling component, such as a TEC, altogether. The removal of the active cooling component also significantly reduces the power consumption of the device, yet the heat transfer assembly still maintains a suitable temperature controlled environment within the device or subassembly.

Referring now to FIG. 4, a side view of an exemplary arrangement of a device 400, such a transmitter optical subassembly, according to another embodiment of the invention, is shown. The device 400 employs the heat control system of the invention in another configuration of an optical or optoelectronic device or subassembly to lower the power consumption of the device, yet still maintain suitable temperature control of the heat generating components of the device. As shown in FIG. 4, the device 400 has first heat generating component(s) 402, such as a laser and/or other electronics, which are in thermal connection to a heat transfer assembly 404. In this embodiment, the device 400 may have second heat generating component(s) 406, such as an etalon or other electrical components, which are in thermal connection with an active cooling components, 408, such as a thermo-electric cooler. The heat transfer assembly 404, such as a heat pipe, is positioned in thermal connectivity with the first heat generating component 404 and the active cooling component is omitted from this portion of the device 400 such that the passive heat control element 404 is the primary heat removal mechanism for the thermally connected first heat generating components 404. The heat transfer assembly 404 is positioned between the first heat generating component 402 and the bottom plate 410 of the housing 412 of the device 400. The bottom plate 414 of the active cooling component 408 is in thermal connectivity with the bottom plate 410 of the housing 412 and the top plate 418 of the active cooling component 408 is in thermal connectivity with the second heat generating component(s) 406. The bottom plate 410 of the device 400 serves as a heat conducting material to transfer heat from the active cooling component 408 to the heat transfer assembly 404, thus dissipating heat from the second heat generating component 406 through the active cooling component 408 and lowering the power consumption of the device 400. In this manner, the heat transfer assembly 404 removes heat from both the first and second heat generating components 402, 406.

According to this embodiment, when the device 400 is a transmitter optical subassembly (TOSA) or receiver optical subassembly (ROSA) or other optical package, the bottom plate 410 of the TOSA or ROSA housing 412, is the bottom of the optical package where the maximum heat is transferred from the heat rejecting side of the TEC. The bottom plate 410 is mounted directly to the bottom side 414 of the active heat removal component 406 and also to the bottom side 416 of the heat transfer assembly 404 e.g., a heat pipe, or equivalent passive assembly using a low thermal impedance bonding material. The top side 418 of the heat transfer assembly 404 is also in thermal connection to the first heat generating component 402. Thus, the passive heat removal component 404 dissipates heat from both the first heat generating component 402 and the second heat generating component 406, through the heat transfer assembly 404.

As described above in reference to FIG. 4, in each stage that connects the heat generating region or regions on the first and second heat generating component(s), such as photonic circuit or supporting electrical circuits, it is preferable to keep a minimum thermal resistance path between the heat removal elements and the heat transfer assembly 404. As shown in FIG. 4, using the heat transfer assembly, the heat differential from the hot side to the cold side to the ambient air is transferred more effectively by using the passive device 404. The heat transfer assembly 404 may use a phase change of a liquid or other material to transfer heat and the heat transfer assembly 404 uses air flow or other methods to create a heat differential or gradient in the element 404. The use of a phase change process allows the element 404 to perform work on removing the heat from the TEC 306 without external power and also remove heat from the heat generating elements 402 which are not cooled with an active cooling device. This removal of heat with the passive element 404 allows for removal of one or more active cooling elements, and allows the TEC 408 to be run at a lower current, thereby reducing the power consumption of the TEC 408, and overall power consumption of the device 400.

Referring now to FIGS. 5 through 8, other embodiments of the heat control system according to the present invention are shown, with like numbers referring to like elements. As shown in FIGS. 5-8, the passive heat control element can be incorporated with increasing levels of mechanical, thermal and electronic integration, where each improvement of integration is designed to remove thermal impedance, simplify manufacturing, reduce size and reduce overall power consumption and reduce cost and complexity of manufacturing as well as improve reliability.

Figure 5:
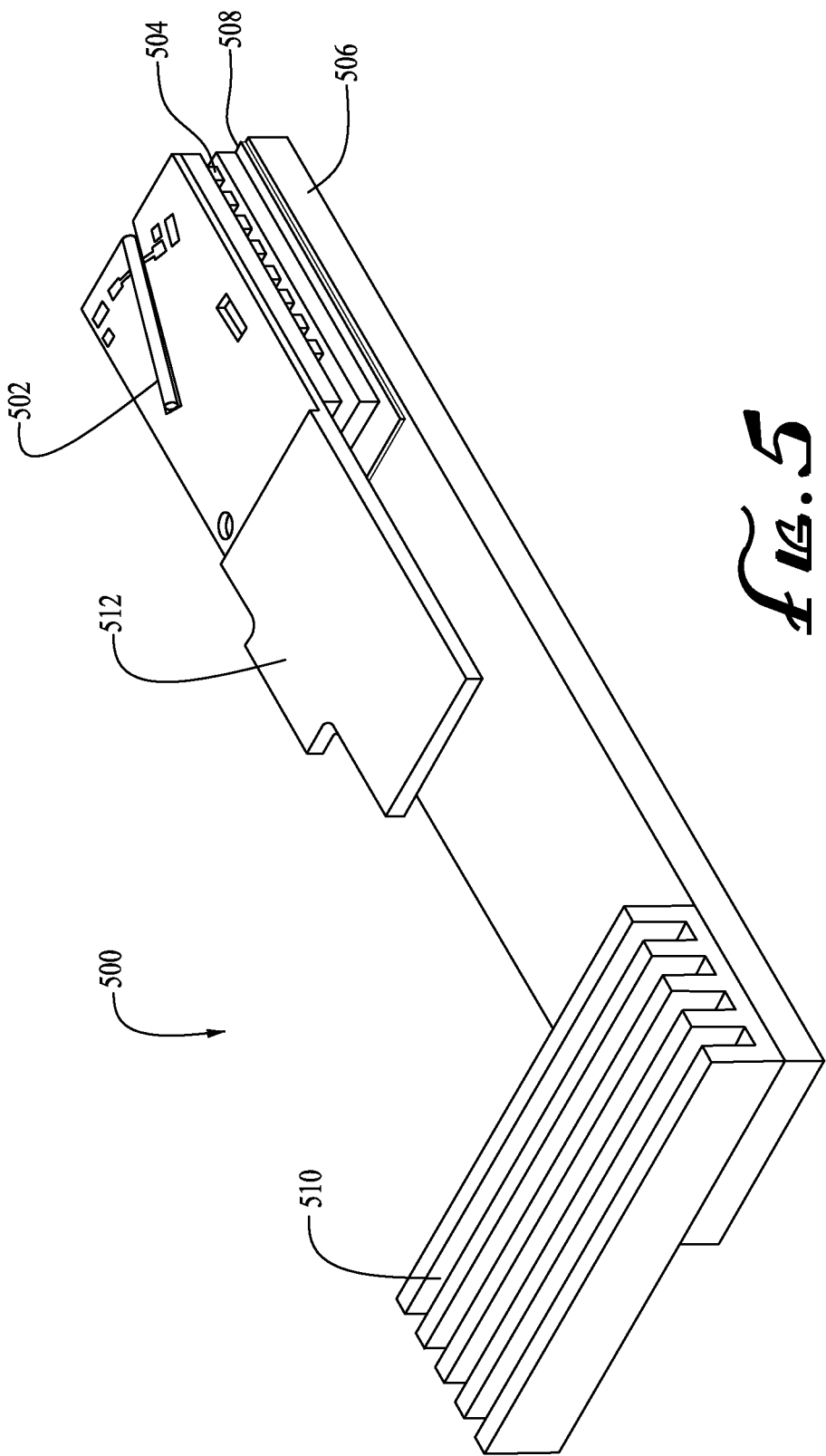
FIG. 5 is a perspective view of an exemplary arrangement of the heat control system according to the present invention, showing a TEC in thermal connection with a heat transfer assembly and a circuit.

Referring again to FIG. 5, a perspective view of another embodiment of the heat control system according to the present invention is shown. FIG. 5 shows a heat control system 500 for use in the heat control of a photonic or optoelectronic circuit. The heat control system 500 comprises a photonic integrated circuit or optoelectronic circuit 502 which is positioned in thermal connectivity to an active cooling component 504, which in a preferred embodiment is a thermoelectric cooler (TEC). The TEC 504 is then thermally connected to the heat transfer assembly 506. As the TEC 504, is in thermal connection to the circuit 502, and also in thermal connection to the heat transfer assembly 506, the heat transfer assembly 506, dissipates heat from the TEC 504 and the circuit 502. As also shown in FIG. 5, the heat transfer assembly 506, may be thermally connected to the TEC 504 through a conductive platform 508, which is disposed in between the heat transfer assembly 506 and the active cooling component (TEC) 504. In some embodiments, when the system is incorporated into a housing, the heat transfer assembly 506 is exposed at least in part externally to the housing. Preferably, the heat transfer assembly 506 extends substantially the width of the circuit 502 and a length of the heat transfer assembly is exposed at least in part externally to the housing (not shown). As also shown in FIG. 5, the heat transfer assembly 506 provides a mechanical supporting structure for the heat generating component 502 and the active cooling component 504. The heat transfer assembly 506 also can provide a platform for forming electrical interconnections, an electrical ground plane or planes and a thermal ground plane. More preferably, in the heat control system 500, the heat generating components 502 and active cooling components 504 are configured to stack vertically on top of the heat transfer assembly 506, such that the system 500 can be sized to fit within various standard form factors as described herein and also future form factors. The heat transfer assembly is preferably less than 1 mm in height, and extends substantially over the area of the active cooling component and can serve as a mechanical supporting structure for the assembly. Preferably, the heat transfer assembly is in direct thermal connection and direct mechanical connection with the active heat removal element, and the active heat removal is in direct thermal connection and direct mechanical connection with at least one of the heat generating components. As also shown in FIG. 5, the heat control system may also have a heat dissipating apparatus 510 in thermal connection with the heat transfer assembly 506. The heat dissipating apparatus 510 may be a fin assembly, as shown in FIG. 5, or another similarly operating device which serves to radiate heat out of the heat transfer assembly 506.

Preferably, according to this embodiment, the photonic or optoelectronic circuit 502 and/or other electronic components and circuits are mounted directly to an electronic interconnect and deposited directly onto the heat absorbing side of the TEC 504. Also preferably, the photonic integrated circuit or optoelectronic circuit 502 is positioned on a ribbon 512, or flex circuit, mounted on a flexible substrate, such as polyimide, PEEK, or a transparent conductive polyester substrate. The ribbon 512 or other electronic interconnect is directly attached to traces patterned on the TEC 504. The TEC 504 is then connected to the thermal removal stackup and heat transfer assembly 506 as shown in FIG. 5. However, other embodiments are within the scope of the invention, as will be understood by those of skill in the art with reference to this disclosure.

Figure 6:
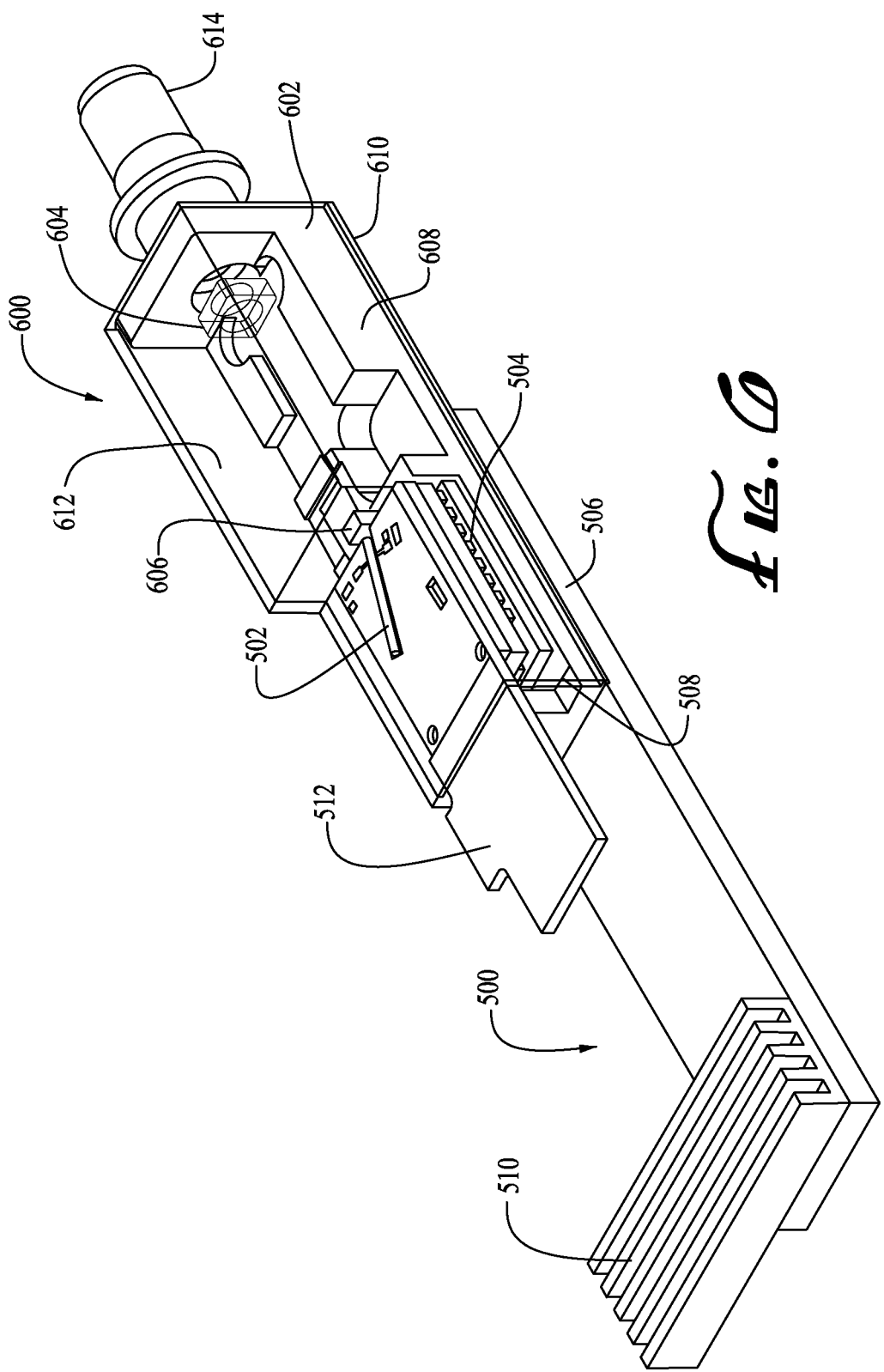
FIG. 6 is a perspective view of the exemplary heat control system presented in FIG. 5, incorporated into an exemplary transmitter optical subassembly.

Referring now to FIG. 6, a perspective view of the embodiment of the heat control system shown in FIG. 5, incorporated into an exemplary transmitter optical subassembly 600 is shown. As shown in FIG. 6, the transmitter optical subassembly 600 comprises a housing 602 that forms an interior space for housing the components, such as focusing and collimating lenses 604 and 606, respectively. The transmitter optical subassembly 600 is preferably tunable and overall of a small size for use in an optical transceiver or other small sized application. The housing 602 has a generally rectangular body with exterior walls 608 and a bottom 610 and a top 612. An optical ring assembly, or interface 614 extends outward from the housing 602. Positioned at least partially within the housing 602 is the photonic integrated circuit 502 and heat control system shown in FIG. 5. The photonic integrated circuit 502 is positioned at least partially within the housing 602. The heat generating components 502 (including the photonic integrated circuit) and active cooling components 504 are configured to stack vertically on top of the heat transfer assembly 506. The heat transfer assembly 506 is thermally connected to the TEC 504 through a conductive platform 508, which is disposed in between the heat transfer assembly 506 and the active cooling component (TEC) 504. The heat transfer assembly 506 is positioned exterior to the bottom 610 of the housing 602, and in thermal connection to the TEC 504. The heat transfer assembly 506 extends substantially the width of the housing 602 and extends beyond the length of the housing 602. As also shown in FIG. 6, the heat control system 500 has a heat dissipating apparatus 510 in thermal connection with the heat transfer assembly 506 to radiate heat out of the heat transfer assembly 506.

In a preferred embodiment, the photonic or optoelectronic circuit 502 is mounted to a carrier such as silicon nitride along with other electronic components or circuits including but not limited to a thermistor, termination resistors and capacitors, inductors, modulator or laser driver circuits, transimpedance amplifiers (TIAs). The DC and RF signals that communicate with the photonic or optoelectronic circuit 502 or other electronic components and circuits are routed via a flex ribbon cable 512 or circuit card that may or may not extend all the way to the photonic or optoelectronic circuit, and wire bonds, bump bonds or other electrical connection mechanism is used to connect to the photonic or optoelectronic circuit. The photonic or optoelectronic circuit die on carrier is bonded using high thermally conductive material like solder or thermal epoxy to the TEC 504 and the TEC 504 in turn is mounted to the bottom of a package made of a thermally conducting material like kovar, which in turn is mounted using solder or thermal epoxy to the hot side of the heat transfer assembly 506 (e.g., the heat pipe type assembly). The heat pipe 506 routes heat to a place where a large surface area component like a heat sink 510 is connected, as shown in FIGS. 5 and 6. Heat is then removed from the cold side of the heat transfer assembly 506 using air flow or convection. The laser and TEC assembly are incorporated into a package like a TOSA, ROSA or other package, which in turn is mounted to the heat transfer assembly 506 using high thermal conducting epoxy or solder. The example in FIG. 6 shows as subset of other components that may be in the optical package including lenses 604, 606 and the fiber connecting assembly 614.

FIG. 7 is a perspective view of another exemplary arrangement of the heat control system 500 according to the present invention. As shown in FIG. 7, an active cooling device, shown in FIG. 7 as a TEC 504 is in thermal connection with a heat transfer assembly 506 and a circuit and/or electronic interconnect assembly 502 that can contain DC and/or RF electrical interconnections, power and ground connections or conducting planes, connections to and from the heat generating photonic or optoelectronic circuit 502 and can also contain electronic circuits digital and/analog and electronic discrete components, and sensing elements like thermistors. Examples of the circuit and/or electronic interconnect assembly 502 include but are not limited to flex circuits, rigid circuits and wire bonds or other electrical bonding technique. In the embodiment of the heat removal system 500 of FIG. 7, the photonic or optoelectronic circuit 502 is shown with further integration.

FIG. 8 is a perspective view of another exemplary arrangement of the heat control system 500 according to the present invention. FIG. 8 shows a heat transfer assembly in direct thermal connection to a circuit 502 and flex ribbon 512 and can support directly on the heat transfer assembly, patterning of various insulator layers and materials and conductor connections or direct attach of a circuit 502 or flex ribbon 512 or any combination thereof. As shown in FIG. 8, the photonic or optoelectronic circuit 502 and electronics are mounted directly to the heat transfer assembly (heat pipe type assembly) 506 greatly minimizing the thermal impedance between the heat generating elements or elements to be temperature stabilized and the heat transfer assembly. The ribbon or flex interconnect 512, as shown in FIG. 5 and described above, is also mounted directly on the heat transfer assembly 506. According to this embodiment, the heat generating sources are bonded directly to the hot side of the heat pipe type assembly removing almost all thermal resistance between the heat generating sources and the heat pipe. The heat dissipating apparatus 510 is in thermal connection with the heat transfer assembly 506 (heat pipe type assembly) to radiate heat out of the heat transfer assembly 506. The advantage of this level of integration is that this configuration puts the heat generation sources right on the heat transfer assembly, making a more efficient to phase change to the liquid inside the heat transfer assembly; and creates a differential to transport the vapor phase of the heat transfer assembly to the cold side of the heat transfer assembly. According to this embodiment, the power requirement of the optical or optoelectronic device or subassembly incorporating this embodiment is significantly lowered, as there is no TEC and corresponding power is required to supply the TEC.

In preferred embodiments according to the invention described herein, the heat generating components of the devices and subassemblies described herein, such as photonic or optoelectronic circuits are thermally connected to the heat removal system. For example, the photonic or optoelectronic circuits may be soldered to a thermally conducting carrier like silicon nitride. The solder and die attach is preferably designed to minimize the thermal resistance of the photonic or optoelectronic circuit heat generating junction to the heat removal system. In a more preferred embodiment, the active junction of light emitting or detecting photonic circuits are located at the top of a chip, where typically the metal interconnects are located, or the chip may be flip chip mounted with the electronic connections mounted directly to electrical contacts on the carrier. Consideration must be given to the location of the active light emitter or detector and how it is coupled off the chip, to a fiber or to a lens imaging system. The chip carrier is then typically soldered to the heat absorbing side (hot side) of a thermo-electric cooler (TEC) that in turn has its heat rejecting side (cold side) soldered to a subassembly frame or other thermal conducting material or component, which is then thermally connected to the heat transfer assembly.

In another preferred embodiment, the heat transfer assembly comprises a substantially planar heat pipe type assembly which is a two dimensional vessel that combines both thermal conductivity and phase transition, or other similarly performing device. The substantially planar two-dimensional vessel is able to transport large amounts of heat due to the latent heat evaporation being so high that the planar heat pipe type assembly can transport much higher heat than an equivalent solid material. Accordingly, a major advantage of the invention is the ability of the devices and subassemblies described herein, which use the heat transfer assembly to transport much more heat away from the photonics, optoelectronics and electronics in the communications assembly than standard solid materials. A preferred example of suitable planar heat pipe type technology is a heat transfer assembly that has the desired attributes of high thermal conductivity in a very small footprint, low profile, and fabricated from a material that can be connected thermally to other materials and can act as a substrate for metallization and mounting photonic and electronic circuits. A more preferred heat transfer assembly is a titanium based flat (i.e., planar) heat pipe based on nano-structured titanium. The Ti-based heat pipe fabrication and operation is described in "A Flat Heat Pipe Architecture Based on Nanostructured Titania," Changsong Ding, Gaurav Soni, Payam Bozorgi, Brian D. Piorek, Carl D. Meinhart, and Noel C. MacDonald, *Journal of Microelectromechanical Systems*, Vol. 19, No. 4, August 2010; US Patent App. Pub. No. US 2011/0120674 A1 (MacDonald). The Ti based planar heat pipe type assembly can be fabricated into a very low profile (e.g. less than 1 mm) thermal ground plane by micro welding two microfabricated substrates to form the hermetically sealed vapor chamber that acts to conduct heat through the heat pipe phase change mechanism. The planar heat pipe type assembly has nano scale pillars, made of titanium or another suitable material, that form a very high surface area and act as a hydraulic pump by wicking the liquid and greatly facilitating the heat transfer process. Using the nano scale pillar based planar heat pipe type assembly has other desirable attributes including the ability to fabricate flat shapes for integration, better performance than other flat heat pipe materials, high fracture tolerance and lower oxidation than copper and other heat pipe materials. An example of the titanium based heat pipe and its wicking structure relative to the hot and cold (heat source and heat sink respectively) are in FIG. 1 of US 2011/0120674 A1. The heat pipe embodiment described for this application has been shown to have an effective thermal conductivity of over 350.

Also preferably, the housing of the devices described herein comprises kovar, or another suitable material that embodies desirable properties for high heat transfers, low mechanical distortion, good electrical and thermal bonding properties, can be machined or manufactured easily, enables multiple attachment processes including soldering and epoxy attach. The bottom of the housing is preferably of a suitably conductive material, as will be understood by those of skill in the art with reference to this disclosure.

As described herein, the advantages of the present invention include, without limitation, reduced power consumption for compact optical and optoelectronic devices and subassemblies, smaller footprint, lower cost, and broader applications of optical, integrated optic and optoelectronic technologies.

While the foregoing written description of the invention enables one of ordinary skill to make and use what is considered presently to be the best mode thereof, those of ordinary skill will understand and appreciate the existence of variations, combinations, and equivalents of the specific embodiments, methods, and examples herein. And, although the present invention has been discussed in considerable detail with reference to certain preferred embodiments, other embodiments are possible. Therefore, the scope of the appended claims should not be limited to the description of preferred embodiments, methods, and examples contained herein.

What is claimed is:

1. An optical communications apparatus, the optical communications apparatus comprising:
    a transmitter optical subassembly;
    a receiver optical subassembly;
    a housing for enclosing the transmitter optical subassembly and the receiver optical subassembly;
    an active cooling component for removing heat from at least one of one or more heat generating components, the active cooling component including a first direct thermal connection and a direct mechanical connection with the at least one of one or more heat generating components; and
    a heat transfer assembly having a second direct thermal connection with the active cooling component, the second direct thermal connection comprising a conductive platform,
    wherein the heat transfer assembly provides a mechanical supporting structure for one or more of the heat generating components.

2. The optical communications apparatus of claim 1, wherein the heat transfer assembly includes a substantially planar two dimensional vessel which combines both thermal conductivity and phase transition, and wherein the conductive platform serves as a base of the housing.

3. The optical communications apparatus of claim 1, wherein the one or more heat generating components comprise a laser, a laser transmitter, or a non-heat generating element that requires temperature stabilization.

4. The optical communications apparatus of claim 1, wherein the one or more heat generating components comprise a photonic integrated circuit, or an optoelectronic circuit, and the active cooling component is in thermal connectivity with the photonic integrated circuit or the optoelectronic circuit, and the heat transfer assembly is in thermal connection with the active cooling component.

5. The optical communications apparatus of claim 1, wherein the conductive platform is disposed between the heat transfer assembly and the active cooling component, and the heat transfer assembly is exposed at least in part external to the housing.

6. The optical communications apparatus of claim 1, wherein the heat transfer assembly extends substantially along a width of the housing and a length of the heat transfer assembly is exposed at least in part externally to the housing.

7. The optical communications apparatus of claim 1, wherein the heat transfer assembly is less than 1 mm in height, and extends substantially over an area of the active cooling component.

8. The optical communications apparatus of claim 1, wherein the heat transfer assembly is a substantially planar heat pipe type assembly comprising a two-dimensional vessel having interior nano-structures or micro-structures.

9. The optical communications apparatus of claim 1, wherein the one or more heat generating components and active cooling components are configured to stack vertically on a top of the heat transfer assembly.

10. The optical communications apparatus of claim 1, wherein the heat transfer assembly is in direct thermal connection and direct mechanical connection with an active heat removal element.

11. The optical communications apparatus of claim 1, wherein the heat transfer assembly is in direct thermal connection and direct mechanical connection with the active cooling component, and the active cooling component is in direct thermal connection and direct mechanical connection with the at least one of the one or more heat generating components.

12. The optical communications apparatus of claim 1, wherein the optical communications apparatus further comprises a heat dissipating apparatus in thermal connection with the heat transfer assembly.

* * * * *